United States Patent
Do et al.

(10) Patent No.: US 11,004,991 B2
(45) Date of Patent: May 11, 2021

(54) PHOTOVOLTAIC SOLAR CELL AND METHOD OF MANUFACTURING PHOTOVOLTAIC SOLAR CELL

(71) Applicant: LG ELECTRONICS INC., Seoul (KR)

(72) Inventors: Younggu Do, Seoul (KR); Sungjin Kim, Seoul (KR); Hyungwook Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 40 days.

(21) Appl. No.: 15/904,030

(22) Filed: Feb. 23, 2018

(65) Prior Publication Data
US 2018/0248060 A1    Aug. 30, 2018

(30) Foreign Application Priority Data

Feb. 24, 2017   (KR) .................. 10-2017-0025012
Dec. 4, 2017    (KR) .................. 10-2017-0165374

(51) Int. Cl.
*H01L 31/04*      (2014.01)
*H01L 31/0216*    (2014.01)
(Continued)

(52) U.S. Cl.
CPC ........ *H01L 31/04* (2013.01); *H01L 31/02167* (2013.01); *H01L 31/02363* (2013.01);
(Continued)

(58) Field of Classification Search
CPC ... H01L 31/18; H01L 31/04; H01L 31/02167; H01L 31/022425; H01L 31/0352;
(Continued)

(56) References Cited

U.S. PATENT DOCUMENTS

2011/0139243 A1   6/2011  Shim et al.
2012/0064659 A1*  3/2012  Park .................. H01L 31/02167
                                                        438/71

FOREIGN PATENT DOCUMENTS

CN     105655427 A    6/2016
JP     2016-103642 A  6/2016
(Continued)

OTHER PUBLICATIONS

Dilonardo et al., "Silicon doping effect on SF6/O2 plasma chemical texturing," Journal of Applied Physics, vol. 110, No. 1, 013303, 2011 (Published online Jul. 6, 2011), pp. 013303-1 to 013303-5.

*Primary Examiner* — Marcos D. Pizarro
*Assistant Examiner* — Antonio B Crite
(74) *Attorney, Agent, or Firm* — Birch, Stewart, Kolasch & Birch LLP

(57) ABSTRACT

Provided is a method of manufacturing a photovoltaic solar cell, including: forming a first conductivity type region that contains a first conductivity dopant, on one surface of a semiconductor substrate and an opposite surface that is opposite to the one surface; removing the first conductivity type region formed on the opposite surface of the semiconductor substrate by performing dry etching; and forming a
(Continued)

second conductivity type region that contains a second conductivity type dopant, on the opposite surface of the semiconductor substrate.

14 Claims, 8 Drawing Sheets

(51) Int. Cl.
    *H01L 31/068* (2012.01)
    *H01L 31/20* (2006.01)
    *H01L 31/18* (2006.01)
    *H01L 31/0224* (2006.01)
    *H01L 31/0236* (2006.01)
    *H01L 31/0352* (2006.01)
    *H01L 31/0376* (2006.01)

(52) U.S. Cl.
    CPC .. *H01L 31/022425* (2013.01); *H01L 31/0352* (2013.01); *H01L 31/03762* (2013.01); *H01L 31/068* (2013.01); *H01L 31/1804* (2013.01); *H01L 31/1864* (2013.01); *H01L 31/1868* (2013.01); *H01L 31/202* (2013.01); *Y02E 10/547* (2013.01); *Y02P 70/50* (2015.11)

(58) Field of Classification Search
    CPC ........... H01L 31/02363; H01L 31/1868; H01L 31/02366; Y02P 70/521
    See application file for complete search history.

(56) References Cited

FOREIGN PATENT DOCUMENTS

| | | | |
|---|---|---|---|
| KR | 10-2009-0062152 | A | 6/2009 |
| KR | 10-2010-0013771 | A | 2/2010 |
| KR | 10-2013-0057285 | A | 5/2013 |
| KR | 10-2013-0100432 | A | 9/2013 |
| KR | 10-2014-0105095 | A | 9/2014 |
| KR | 20140105095 | A * | 9/2014 |
| KR | 10-2015-0124292 | A | 11/2015 |
| KR | 20150124292 | A * | 11/2015 |
| KR | 10-2016-0029501 | A | 3/2016 |
| KR | 101702953 | B1 * | 2/2017 |

* cited by examiner

PHOTOVOLTAIC SOLAR CELL AND METHOD OF MANUFACTURING PHOTOVOLTAIC SOLAR CELL

CROSS-REFERENCE TO RELATED APPLICATION

This application claims the priority benefit of Korean Patent Application No. 10-2017-0025012 filed on Feb. 24, 2017 and No. 10-2017-0165374 filed on Dec. 4, 2017 in the Korean Intellectual Property Office, all of which are hereby incorporated by reference in their entirety.

BACKGROUND OF THE INVENTION

1. Field of the Invention

The present invention relates to a photovoltaic solar cell and a method of manufacturing the photovoltaic solar cell, and more particularly to a photovoltaic solar cell in which a conductivity type region is removed and a minute V-shaped protrusion is formed and a method of the photovoltaic solar cell.

2. Description of the Related Art

Due to increased energy consumption, there is a growing concern over expected rapid depletion of existing energy sources, such as petroleum and coal. Thus, alternative energy sources, as alternatives to the existing energy sources, have been getting a lot of attention in recent years. Among the alternative energy sources, a photovoltaic solar cell is highlighted as a next-generation battery that converts solar energy directly into a flow of electrons using a semiconductor element.

The photovoltaic solar cell is manufactured by forming various layers and electrodes according to the design thereof. Then, the efficiency of the photovoltaic solar cell is determined according to the design of the various layers and electrodes. The low efficiency of the photovoltaic solar cell needs to be overcome for commercialization. Thus, various layers and electrodes are desirably designed to maximize the efficiency of the photovoltaic solar cell.

SUMMARY OF THE INVENTION

An object of the present invention is to provide a photovoltaic solar cell of which the efficiency is improved and which has the advanced capability of being processed, and a method of manufacturing the photovoltaic solar cell.

In view of the technical problems described above, several embodiments of the present are provided.

Specifically, according to an embodiment of the present invention, there is provided a method of manufacturing a photovoltaic solar cell, the method including: forming a first conductivity type region that contains a first conductivity dopant, on one surface of a semiconductor substrate and an opposite surface that is opposite to the one surface; removing the first conductivity type region formed on the opposite surface of the semiconductor substrate by performing dry etching; and forming a second conductivity type region that contains a second conductivity type dopant, on the opposite surface of the semiconductor substrate.

In the method according to the aspect of the present invention, the removing of the first conductivity type region may be performed by reactive ion etching (RIE), and in the removing of the first conductivity type region, sulfur hexafluoride gas and oxygen gas may be used.

In the method according to the aspect of the present invention, a volume ratio of the sulfur hexafluoride gas to the oxygen gas may be 3 to 5.

In the method according to the aspect of the present invention, an amount of the sulfur hexafluoride gas may be used at a flow rate of 8000 sccm to 10000 sccm.

In the method according to the aspect of the present invention, the method may further include forming a minute V-shaped protrusion by the reactive ion etching between the dry etching of the first conductivity type region and the forming of the second conductivity type region.

In the method according to the aspect of the present invention, the forming of the minute V-shaped protrusion may use sulfur hexafluoride gas, oxygen gas, and chlorine gas.

In the method according to the aspect of the present invention, a volume ratio of the sulfur hexafluoride gas to the oxygen gas may be 1 to 2.

In the method according to the aspect of the present invention, a volume ratio of the chlorine gas to the oxygen gas may be 0.2 to 1.

In the method according to the aspect of the present invention, a volume ratio of oxygen gas that is used when removing the first conductivity type region and oxygen gas that is used when forming the minute V-shaped protrusion may be 1.5 to 5.

In the method according to the aspect of the present invention, pressure for forming the minute V-shaped protrusion may be equal to or higher than that for etching the first conductivity type region.

In the method according to the aspect of the present invention, before the forming of the first conductivity type region, a V-shaped protrusion may be not formed on one surface but may be formed on the opposite surface among the one surface and the opposite surface of the semiconductor substrate.

In the method according to the aspect of the present invention, the forming of the opposite surface of the semiconductor substrate may be performed by wet etching.

In the method according to the aspect of the present invention, a minute V-shaped protrusion may be formed on a surface of the V-shaped protrusion.

In the method according to the aspect of the present invention, the etching of the first conductivity type region and the forming of the minute V-shaped protrusion may be performed by an in-situ process.

In the method according to the aspect of the present invention, the method may further include forming a control passivation layer on the first conductivity type region on the one surface of the semiconductor, and the forming of the first conductivity type region and the forming of the control passivation layer may be performed by an in-situ process.

In the method according to the aspect of the present invention, the forming of the second conductivity type region may include diffusing the second conductivity type dopant into the semiconductor substrate.

Specifically, according to another aspect of the present invention, there is provided a photovoltaic solar cell, including: a semiconductor substrate having one surface, an opposite surface opposite to the one surface, and a flank surface connecting the one surface and the opposite surface; a second conductivity type region that is formed on the one surface of the semiconductor substrate; and a first conductivity type region that is formed the opposite surface of the semiconductor substrate, wherein a minute V-shaped protrusion is formed on each of the opposite surface and the flank surface of the semiconductor substrate, and wherein a size of the minute V-shaped protrusion that is formed on the opposite surface of the semiconductor substrate is different from a size of the minute V-shaped protrusion that is formed on the flank surface of the semiconductor substrate.

According to the aspect of the present invention, the size of the minute V-shaped protrusion that is formed on the opposite surface of the semiconductor substrate may be greater than the size of the minute V-shaped protrusion that is formed on the flank surface of the semiconductor substrate.

According to the aspect of the present invention, the size of the minute V-shaped protrusion that is formed on the opposite surface of the semiconductor substrate may be 100 um to 300, and the size of the minute V-shaped protrusion that is formed on the flank surface of the semiconductor substrate may be 50 nm to 100 nm.

According to the aspect of the present invention, a first conductivity type region is formed to be positioned on the opposite surface of the semiconductor substrate, and the first conductivity type region is removed by performing wet etching. Thus, the number of production processes is reduced. As a result, productivity is improved and high etching speed is maintained.

Specifically, according to the aspect of the present invention, by using a doped semiconductor layer, the productivity is improved and at the same time, oxygen gas, sulfur hexafluoride gas, and plaza power are controlled. Thus, the high etching rate is realized.

Furthermore, a process condition for wet etching is controlled and thus a first conductivity type region that remains on an edge portion of the semiconductor substrate is minimized. Thus, leakage current is reduced and thus the efficiency of a photovoltaic solar cell is improved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
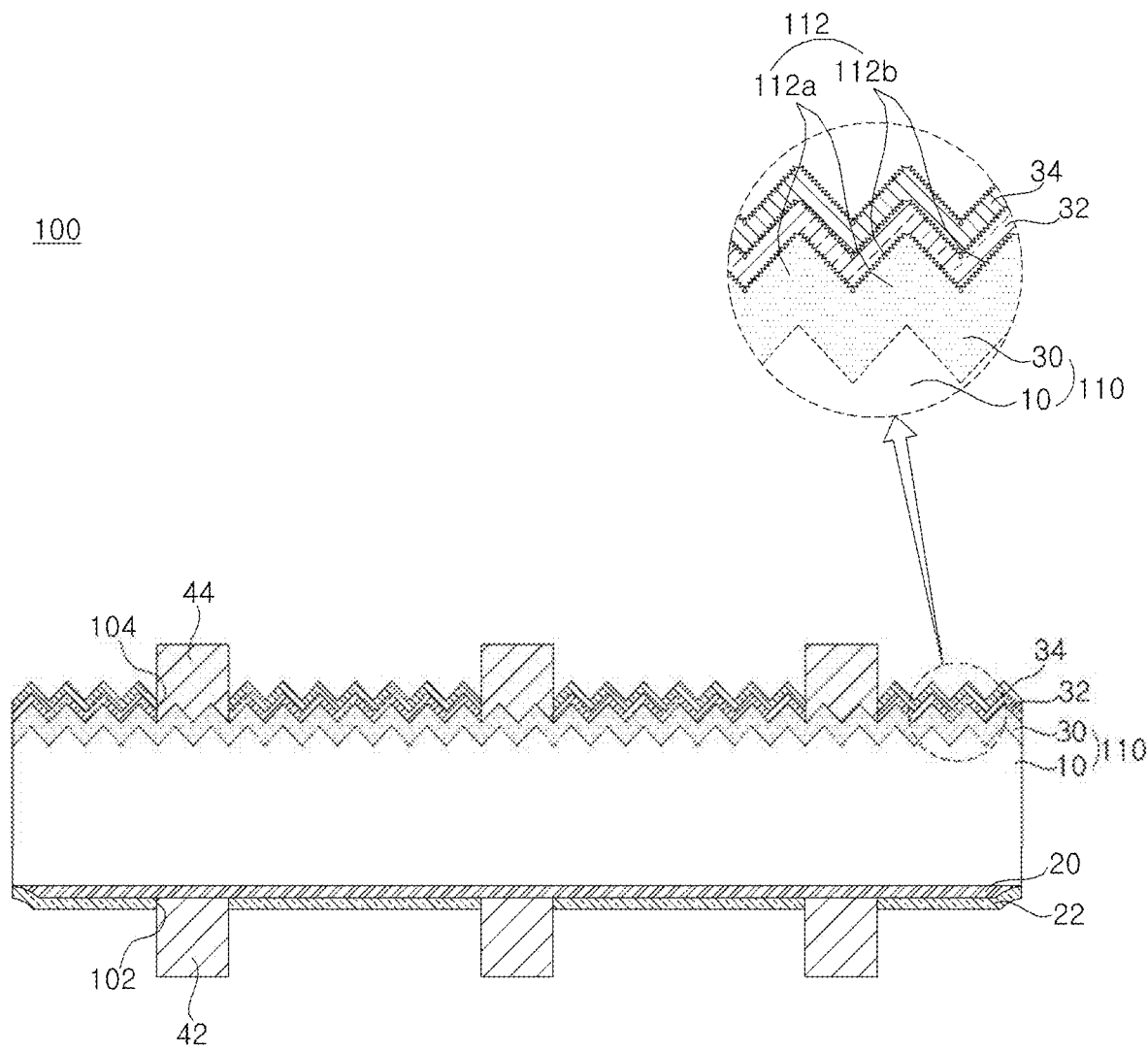
FIG. 1 is a cross-sectional diagram illustrating a cross section of a photovoltaic solar cell according to several embodiments of the present invention.

Advantages and features of the present invention, and methods of achieving the advantages and features are apparent from embodiments that will be described below. However, the present invention is not limited to the embodiments that will be disclosed below and is possibly implemented in various manners. The present embodiments are provided not only for complete disclosure of the present invention, but also for complete appreciation of the scope of the invention by a person of ordinary skill in the art to which the present invention pertains. The present invention is as defined in claims. The same reference numerals throughout the specification refer to the same constituent element.

In order to clearly express various layers and regions, the thicknesses thereof are illustrated enlargedly in the drawings. For convenience in description, the thicknesses of one or several layers and of one or several regions are illustrated exaggeratedly in the drawing.

In addition, in the present specification, when a portion, such as a layer, a film, a region, and a plate is described as being "on" or "over" one other portion, this includes not only a case where a portion is just "on" one other, but also a case where a portion is "over" one other with an intermediary in between. However, when a portion is described as being just "on" one other, this means a case where there is no intermediary between a portion and one other portion. In addition, when a portion, such as a layer, a film, a region, or a plate is described as being "underneath" or "under" one other portion, this includes not only a case where a portion is just "underneath" one other, but also a case where a portion is "under" one other with an intermediary in between. However, when a portion is described as being just "underneath" one other, this means a case where there is no intermediary between a portion and one other portion.

A method of manufacturing a photovoltaic solar cell according to several embodiments of the present invention will be described in detail below with reference to the accompanying drawings.

Figure 2:
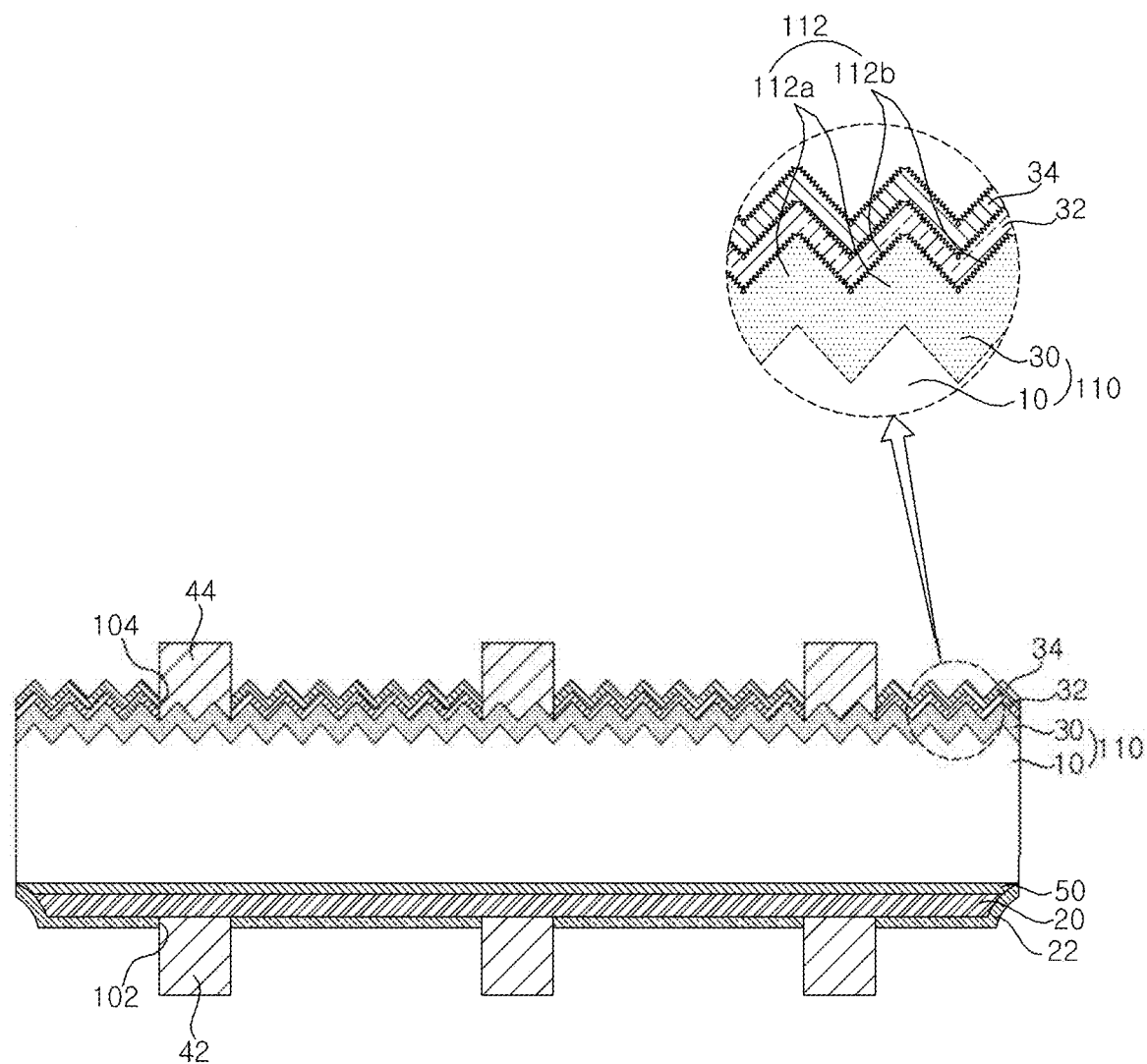
FIG. 2 is a plane-view diagram of a photovoltaic solar cell according to another embodiment of the present invention.

FIG. 1 is a cross-sectional diagram illustrating a photovoltaic solar cell according to an embodiment of the present invention. FIG. 2 is a plane-view diagram of a photovoltaic solar cell according to another embodiment of the present invention.

Specifically, FIG. 1 is a cross-sectional diagram illustrating a cross section of a photovoltaic solar cell according to several embodiment of the present invention.

With reference to FIG. 1, a photovoltaic solar cell 100 according to the present embodiment includes, a semiconductor substrate 110 that includes a base region 10 and a second conductivity type region (or an emitter region) 30 of a second conductivity type, a first conductivity type region 20 of a first conductivity type that is formed on the opposite surface of the semiconductor substrate 110 and that has a different crystal structure than the semiconductor substrate 110, a first electrode 42 that connects to the first conductivity type region 20, and a second electrode 44 that connects to the second conductive type region 30. The photovoltaic solar cell 100 may further include passivation films 22 and 23, a reflection prevention film 24, and the like. Then, with reference to FIG. 2, the photovoltaic solar cell 100 may further include a control passivation layer 50. Additionally, a texturing structure 112 may be present, which includes V-shaped protrusions 112a and minute V-shaped protrusions 112b.

In the present embodiment, before performing dry etching, the first conductivity type region 20 is formed on the semiconductor substrate 110. Thus, process simplification and productivity are improved. Furthermore, when the first conductivity type region 20 that is formed on the semiconductor substrate 110 is removed by the dry etching, plasma power, a volume of sulfur hexafluoride gas, a volume of oxygen gas, and a ratio of sulfur hexafluoride gas to oxygen gas each are controlled. Thus, arcing is prevented from occurring, and at the same time, a high etching rate is realized.

Additionally, the first conductivity type region 20 is effectively removed from an edge portion of the semiconductor substrate 110. Thus, leakage current is minimized. The detail of this will be described in detail below with reference to FIG. 3A to 3G.

Figure 3A:
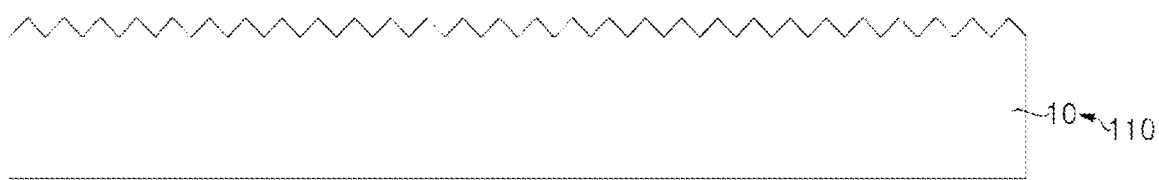
FIGS. 3A to 3G are cross-sectional diagrams illustrating a method of manufacturing a photovoltaic solar cell according to several embodiments of the present invention.
Figure 3B:
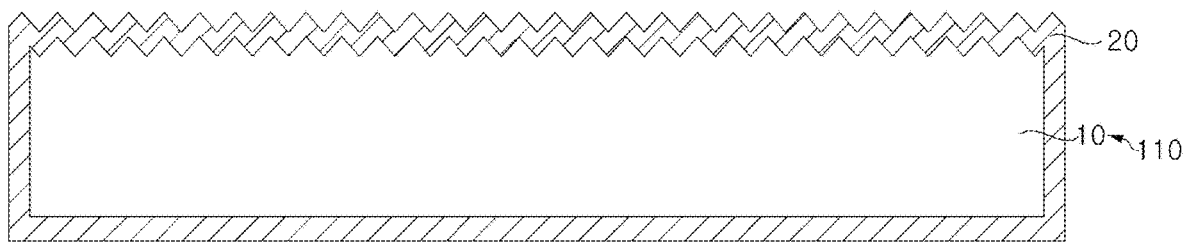
Figure 3C:
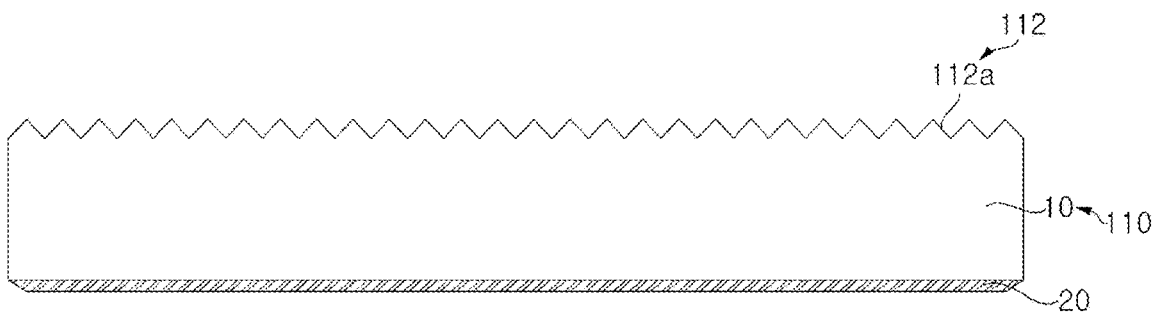
Figure 3D:
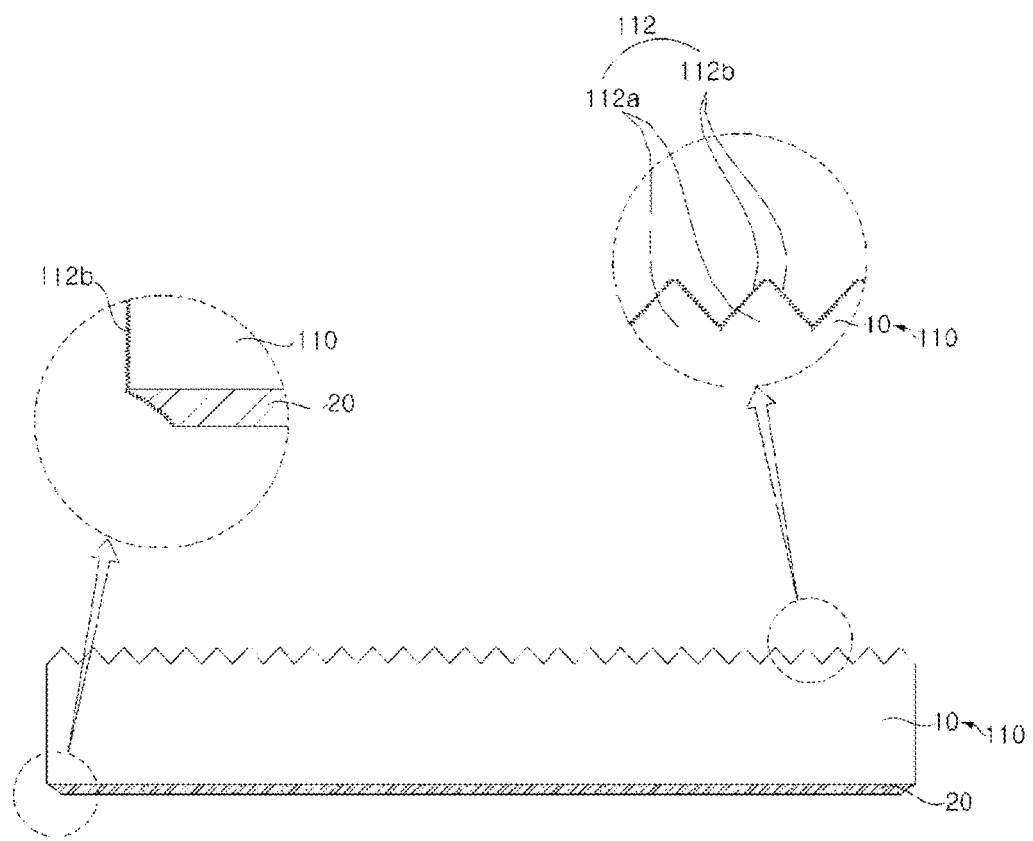
Figure 3E:
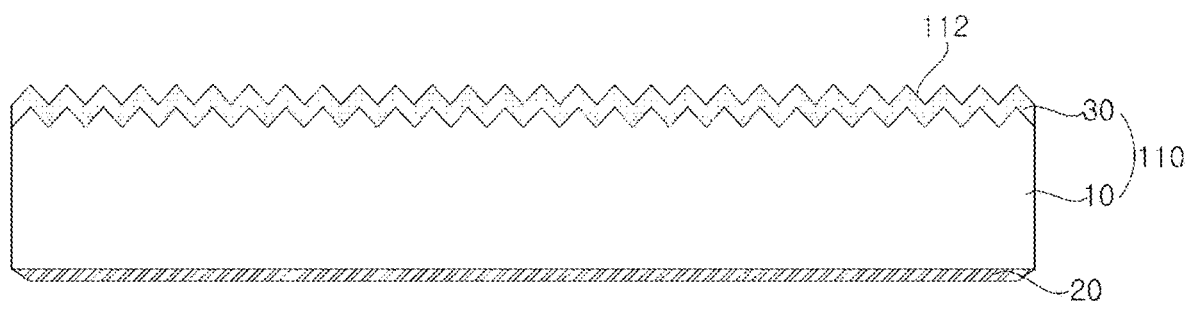
Figure 3F:
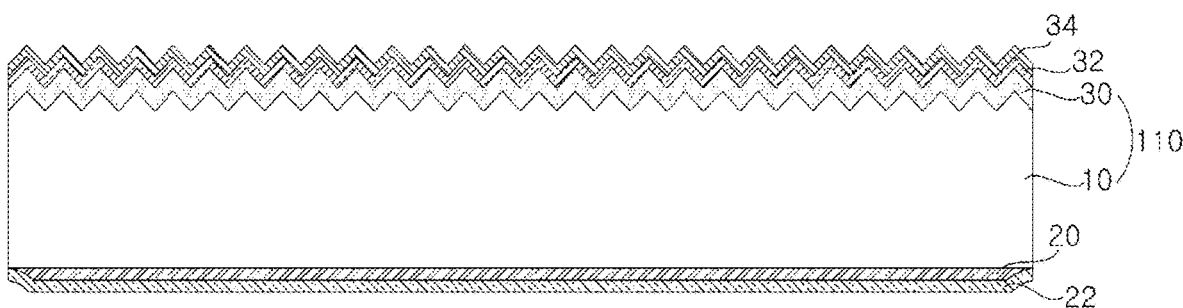
Figure 3G:
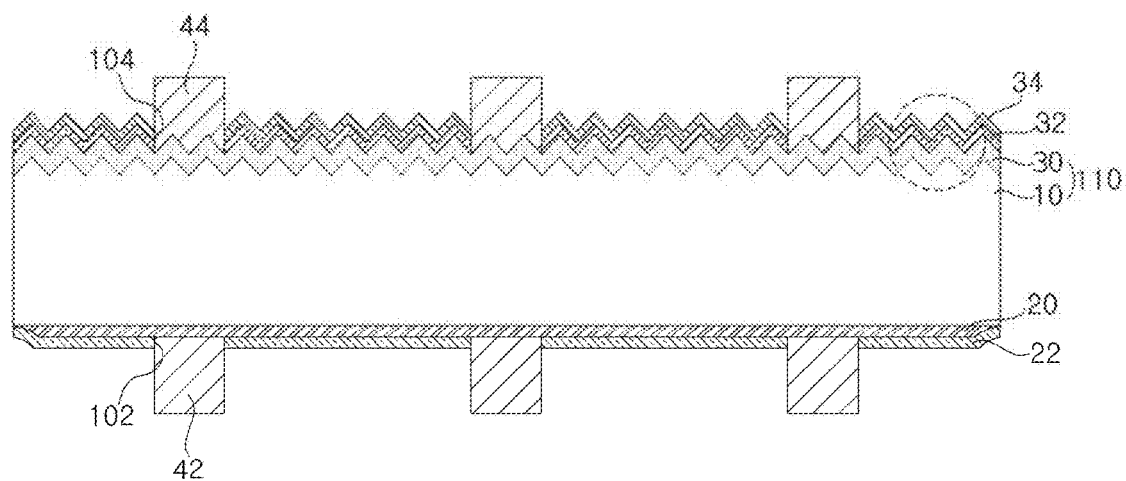

FIGS. 3A and 3G are cross-sectional diagrams illustrating the method of manufacturing the photovoltaic solar cell according to several embodiments of the present invention.

With reference to FIG. 3A, the semiconductor substrate 110 is prepared, and by performing a texturing process, a V-shaped protrusion 112a is formed in the opposite surface of the semiconductor substrate 110.

The semiconductor substrate 110 is made of a crystalline semiconductor that includes a single semiconductor material (an example of which is an element in Group IV). As an example, the semiconductor substrate 110 is made of a monocrystalline or polycrystalline semiconductor (an example of which is monocrystalline or polycrystalline silicon).

Particularly, the semiconductor substrate 110 is made of a monocrystalline semiconductor (for example, a monocrystalline semiconductor wafer, more specifically, a monocrystalline silicon wafer). When in this manner, the semiconductor substrate 110 is made of a monocrystalline semiconductor (for example, a monocrystalline silicon), the photovoltaic solar cell 100 is based on the semiconductor substrate 110 that is made of a monocrystalline semiconductor that has a high degree of crystallinity and thus few defects. Accordingly, the photovoltaic solar cell 100 has an excellent electrical characteristic.

The V-shaped protrusion 112a is formed in the opposite surface of the semiconductor substrate 110 by performing the texturing process. As an example, an external surface of the V-shaped protrusion 112a is formed to be a surface 111 of the semiconductor substrate 110, and has the shape of a regular- or irregular-sized pyramid. Wet etching is performed for the texturing of the semiconductor substrate 110. However, a position in which the V-shaped protrusion 112a is formed is not limited to the opposite surface, and the V-shaped protrusion 112a may be formed in at least one surface of the substrate. The V-shaped protrusion 112a is not limited to the shape of the pyramid and may take various shapes. Such shapes include jagged shapes, blade shapes, or other shapes having sharp edges or various protrusion and recesses.

The V-shaped protrusion 112a is formed in the opposite surface of the semiconductor substrate 110 by performing the texturing, and thus the roughness of the opposite surface increases. This decreases the reflectivity of light that is incident through the opposite surface or the like of the semiconductor substrate 110. Therefore, an amount of light that reaches up to a pn junction that is formed with the base region 10 and the first or second conductivity type region 20 or 30 increases and thus light loss is minimized.

On the other hand, the wet etching is performed by immersing the semiconductor substrate 110 in a texturing solution. The solution that is used for the wet etching is an alkaline solution (for example, a solution containing potassium hydroxide (KOH)). The wet etching is advantageous in that a process time is short.

The V-shaped protrusion is etched by the wet etching along a crystalline surface of the semiconductor substrate 110, and therefore, the external surface of the V-shaped protrusion 112a is formed to have a fixed crystalline surface (for example, the surface 111). Thus, the V-shaped protrusion 112a has the shape of the pyramid that has four surfaces 111, and has an average size on the order of micrometers. However, the present invention is not limited to this, and the V-shaped protrusion 112a may be formed in such various techniques that the V-shaped protrusion 112a has various shapes, average sizes, size deviations, and the like.

Furthermore, the V-shaped protrusion 112a is formed only in the opposite surface of the semiconductor substrate 110, and thus the recombination of an electron and a hole between an electrode and the semiconductor substrate 110 is reduced during electrode formation that will be described below.

However, a V-shaped protrusion formation process and a V-shaped protrusion formation position are not limited to those described above, and those that are apparent to a person of ordinary skill in the art fall within the scope of the present invention. For example, the V-shaped protrusion may be formed in one surface and the opposite surface of the semiconductor substrate, and may be formed by the dry etching.

In the present embodiment, with reference again to FIG. 1, a first or second conductivity type dopant is introduced into the semiconductor substrate 110 according to the present embodiment in such a manner that the semiconductor substrate 110 has a low doping density, and thus the semiconductor substrate 110 includes the base region 10 of the first or second conductivity type. The base region 10 here of the semiconductor substrate 110 has a lower doping density, a higher resistance, or a lower carrier density than one of the first and second conductivity type regions 20 and 30 that have the same conductivity type as the base region 10.

Additionally, between operations in FIGS. 3A and 3B, the control passivation layer 50 may be formed on one entire surface of the semiconductor substrate 110, the entire opposite surface that is opposite in direction to the one surface, and an entire flank surface that connects between the one surface and the opposite surface.

The control passivation layer 50 plays a dopant control role in preventing a dopant in any one of the first and second conductivity regions 20 and 30 from being excessively diffused into the semiconductor substrate 110, or plays the play of a diffusion barrier. The control passivation layer 50 contains various materials that control the diffusion of the dopant and transfer many carriers. As an example, the control passivation layer 50 includes oxide, nitride, a semiconductor, conductive polymer, or the like. As an example, the control passivation layer 50 is a silicon oxide film that contains silicon oxide. This is because the silicon oxide film is a film that has an excellent passivation characteristic and in which the carrier transfer is facilitated. In addition, with various processes, the silicon oxide film is easily formed on a surface of the semiconductor substrate 110. The control passivation layer 50 here is formed with a technique, such as deposition, thermal oxidation, or chemical oxidation. However, the control passivation layer 50 is not an integral constituent element.

Subsequently, with reference to FIG. 3B, forming of the first conductivity type region 20 is described.

The first conductivity type region 20 here is also formed on the entire semiconductor substrate 110, or on the entire control passivation layer 50 that is positioned not only on one entire surface and the entire opposite surface of the semiconductor substrate 110, but also on the entire flank surface of the semiconductor substrate 110.

In the present embodiment, the first conductivity type region 20 may be formed by performing chemical vapor deposition, more specifically, by low pressure chemical vapor deposition. Accordingly, as described above, the first conductivity type region 20 is formed using the control passivation layer 50 and by performing an in-situ process.

However, the present invention is not limited to the description provided above, and the in-situ processing may not apply to the control passivation layer 50 and the first conductivity type region 20.

The first conductivity type region 20 has the same conductivity type as the semiconductor substrate 110 and has a higher doping density than the semiconductor substrate 110.

Specifically, as an example, the first conductivity type region 20 is formed by performing a deposition technique (for example, a Low-Pressure Chemical Vapor Deposition (LPCVD) technique or the like). The first conductivity type region 20 contains a first conductivity type dopant and has a different crystal structure than the semiconductor substrate 110. For example, the first conductivity type region 20 contains an amorphous semiconductor, a micro-crystalline semiconductor, or a polycrystalline semiconductor (an example of which is amorphous silicon, micro-crystalline silicon, or polycrystalline silicon). Particularly, the first conductivity type region 20 contains a polycrystalline semiconductor (an example of which is polycrystalline silicon).

The first conductivity dopant desirably has the same conductivity type as the base region 10. That is, in a case where the first conductivity type dopant is n-type, an element in Group Vis, such as phosphorus (P), arsenic (As), bismuth (Bi), or antimony (Sb), is used. In a case where the first conductivity type dopant is p-type, an element in Group III, such as boron (B), aluminum (Al), gallium (Ga), or indium (In), is used.

For example, the conductivity types of the semiconductor substrate 110 and the first conductivity type region 20 in the present embodiment are n-type.

However, the conductivity types of the semiconductor substrate 11 and the first conductivity type region 20 are not limited to the description provided above. For example, a pn junction may be formed between the first conductivity type region 20 and the semiconductor substrate 110, with the semiconductor substrate 110 having n-type conductivity and the first conductivity type region 20 having p-type conduction.

Regarding a method of forming the first conductivity type region 20, the first conductivity type region 20 is formed in-situ by performing the LPCVD technique that uses material gas (an example of which is $SiH_4$) containing silicon and dopant gas (an example of which is $POCL_3$ or $B_2H_6$) containing the first conductivity type dopant.

However, a crystal structure of the first conductivity type region, a method of forming the first conductivity type region, and a type of the first conductivity type dopant are not limited to the descriptions provided above, and those that are apparent to a person of ordinary skill in the art fall within the scope of the present invention.

For example, subsequently, the etching of the first conductivity type region 20 and the like, and the forming of a minute V-shaped protrusion 112b is performed by performing two-step reactive ion etching. In the present embodiment, by performing separated reactive ion etching, the first conductivity type region 20 and the like are etched and the minute V-shaped protrusion 112b is formed. Because of this, the first conductivity type region 20 and the like are sufficiently removed and thus the leakage current is minimized, without damaging the shape of the already-formed V-shaped protrusion 112a, when compared with a case where the etching of the conductivity type region etching and the forming of the V-shaped protrusion are performed at the same time.

Specifically, in a case where the etching of the conductivity type region etching and the forming of the V-shaped protrusion are performed at the same time by the reactive ion etching, there is a concern that the shape of the already-formed V-shaped protrusion in the substrate will be damaged. In a case where the etching is performed to a less degree to prevent the V-shaped protrusion in the substrate from being damaged, because the conductivity type region is not removed sufficiently, there is a concern that the leakage current will increase.

In contrast, in the present embodiment, the first conductivity type region 20 and the like are sufficiently removed by the reactive ion etching and then the minute V-shaped protrusion 112b is formed by controlling a process condition and performing the reactive ion etching. Thus, the damage to the already-formed V-shaped protrusion 112a is minimized and at the same time, the first conductivity type region 20 is sufficiently removed. As a result, the leakage current is minimized. Processes relating to this will be described in detail below.

Subsequently, with reference to FIG. 3C, the dry etching of the first conductivity type region 20 will be described.

In the present embodiment, the first conductivity type region 20 that is positioned on the opposite surface and the flank surface of the semiconductor substrate 110 is removed by the dry etching. Specifically, the dry etching of the first conductivity type region 20 is performed by the reactive ion etching (RIE).

The reactive ion etching is a dry etching technique in which, in order to perform the etching, etching gas ($C_{12}$, $SF_6$, $NF_3$, HBr, or the like) is used and then plasma is generated. The reactive ion etching finds application as cross-sectional etching. Then, fundamentally, a corresponding material is etched isotopically without considering a crystal direction of a crystal particle thereof and the like. Accordingly, the entire first conductivity type region 20 and/or the entire control passivation layer 50 that are positioned on the opposite surface and the flank surface of the semiconductor substrate 110 are removed according to a processing condition, such as etching gas. Furthermore, with reference to FIG. 3C, edge portions of the first conductivity type region 20 and/or the control passivation layer 50 that are arranged on one surface of the semiconductor substrate 110 are also partly etched to provide isolation.

Specifically, in the present embodiment, desired etching is performed by adjusting a process condition, such as a type of dry etching gas, pressure division, pressure, and plasma power.

Specifically, a mixture of sulfur hexafluoride gas ($SF_6$) and oxygen gas ($O_2$) is used for the dry etching that removes the first conductivity type region 20 which is positioned on the opposite surface and the flank surface of the semiconductor substrate 110. Sulfur hexafluoride gas plays a role in etching the first conductivity type region 20 and/or the control passivation layer 50. Oxygen gas that forms an oxide film on surfaces of the first conductivity type region and/or the control passivation layer 50 according to a volume ratio of sulfur hexafluoride gas to oxygen. The formed oxide film functions similarly to a mask, and thus plays a play in decreasing or further increasing an etching speed.

In the case of the present embodiment, the first conductivity type region 20 that is doped with the first conductivity type dopant is etched, and, when the etching is performed, the first conductivity type dopant that is contained in the first conductivity type region 20 plays a role of a protection film. Thus, the etching speed decreases when compared with a case where the etching is performed on an intrinsic semiconductor layer. Accordingly, by controlling a volume ratio (particularly, a flow unit that hereinafter expressed in standard cubic centimeter per minute (sccm)) of sulfur hexafluoride gas to oxygen gas, plasma power and an amount of sulfur hexafluoride gas, only the first conductivity type region 20, or only the first conductivity type region 20 and the control passivation layer 50 are selectively etched at a high speed without the damage to the semiconductor substrate 110.

For example, in the present embodiment, a high etching speed is realized by controlling the plasma power that is used for the reactive ion etching that removes the first conductivity type region 20.

Specifically, the plasma power ranges from approximately 25 kw to approximately 30 kw. The high etching speed is realized by maintaining the plasma power within the range described above. In a case where the plasma power exceeds the range described above, arcing occurs and this causes physical damage to the semiconductor substrate 110. Thus, the efficiency of the photovoltaic solar cell is reduced. In a case where the plasma power falls below the range described above, the etching speed decreases, and thus the processing capability decreases.

Furthermore, the plasma power is maintained within the range described above and, at the same time, an amount of sulfur hexafluoride gas is controlled. Thus, the arcing is prevented and at the same time, the high etching speed is realized.

Specifically, an amount of sulfur hexafluoride gas is used at a flow rate of approximately 8000 sccm to approximately 10000 sccm during the reactive ion etching.

By using sulfur hexafluoride gas at the flow rate described above during the reactive ion etching that etches the first conductivity type region 20, the high etching speed is realized and at the same time, sulfur hexafluoride gas consumes a suitable amount of plasma power in the range described above. As a result, the arcing is prevented from occurring and the semiconductor substrate 110 is protected from being etched.

In a case where sulfur hexafluoride gas is used, at a flow rate that is lower than the flow rate described above, during the reactive ion etching that etches the first conductivity type region 20, a density of the plasma is unstable and thus the stability of the process decreases. As a result, the arcing occurs, and the efficiency of photovoltaic solar cell is reduced. In a case where sulfur hexafluoride gas is used, at a flow rate that exceeds the flow rate described above, during the reactive ion etching that etches the first conductivity type region 20, the etching speed in the range described above decreases.

Additionally, during the reactive ion etching that etches the first conductivity type region 20, the amount of sulfur hexafluoride gas is controlled by maintaining the flow rate described above, and at the same time, an amount of oxygen gas is controlled. Thus, the high etching speed is maintained and the semiconductor substrate 110 is protected from being etching.

Specifically, the volume ratio of sulfur hexafluoride gas to oxygen gas is controlled to be 3 to 5, and thus the damage to the V-shaped protrusion 112a that is formed in the semiconductor substrate 110 is minimized and the high etching speed is realized. If the volume ratio is smaller than 3, the volume ratio of sulfur hexafluoride gas to oxygen gas is excessively small. Thus, the etching speed decreases, and a process time increase. If the volume ratio exceeds 5, the etching speed is excessively high, and thus, an etching selection ratio of the first conductivity type region 20 to the semiconductor substrate 110, or an etching selection ratio of the first conductivity type region 20 and the control passivation layer 50 to the semiconductor substrate 110 is small. As a result, the semiconductor substrate 110 is etched together.

That is, in the present embodiment, the plasma power, the amount of sulfur hexafluoride gas, and the ratio of sulfur hexafluoride gas to oxygen gas, among which there are is a close relationship, are controlled at the same time. Thus, without causing the arcing to occur, the high etching is realized, and an effect in which the semiconductor substrate 110 is not etched is achieved.

Furthermore, in the present embodiment, without causing the arcing to occur, the high etching speed is maintained and the semiconductor substrate 110 is not etched. Thus, the leakage current is reduced.

Specifically, as described above, the plasma power, the amount of sulfur hexafluoride gas, and the ratio of sulfur hexafluoride gas to oxygen gas are controlled, and thus the damage to the V-shaped protrusion 112a that is formed in the semiconductor substrate 110 is minimized. At the same time, the first conductivity type region 20 and the control passivation layer 50 that are arranged on the flank surface and the opposite surface of the semiconductor substrate 110 and that are doped with the first conductivity type dopant are sufficiently removed. That is, the first conductivity type region 20 and the control passivation layer 50, which remain on an edge portion of the semiconductor substrate, are minimized, and thus the occurrence of the leakage current is minimized.

Figure 4:
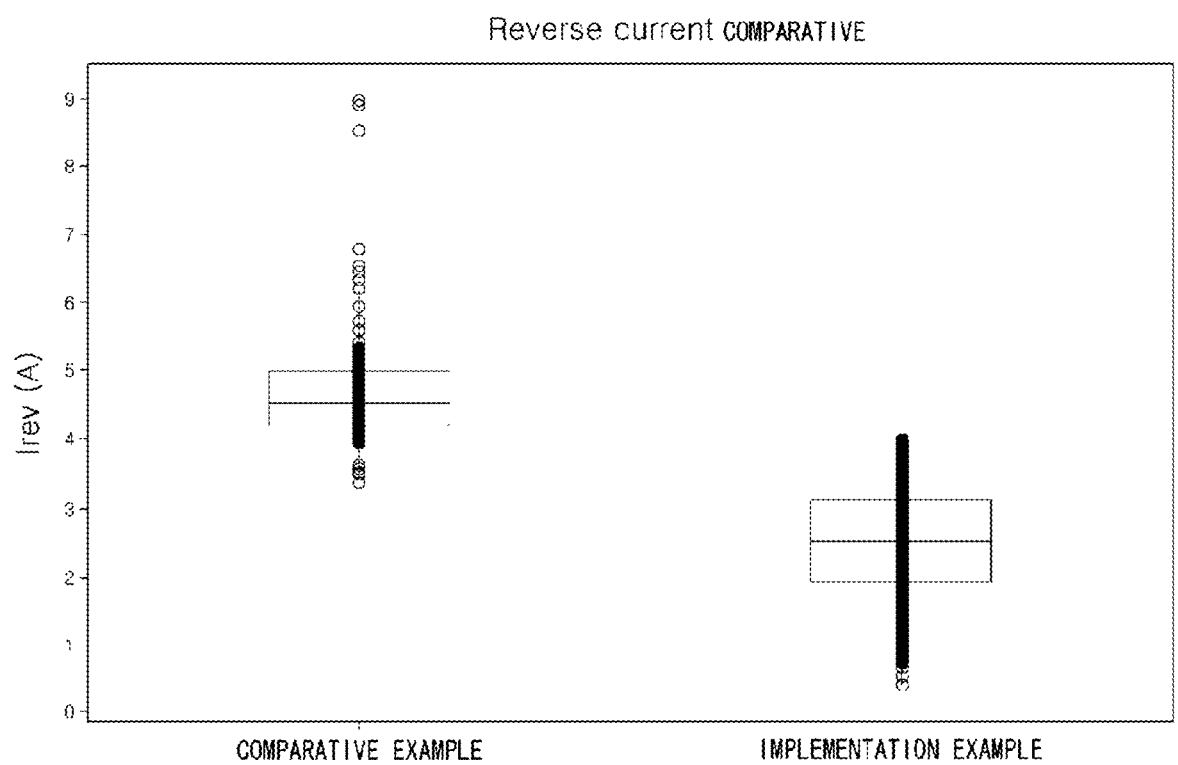
FIG. 4 is a table that results from comparing the photovoltaic solar cell according to the several embodiments of the present invention and a comparative example with each other.

For example, with reference to FIG. 4, the minimization of the leakage current is described.

In the case of an implementation example in FIG. 4, a photovoltaic solar cell is manufactured with a manufacturing method according to the present embodiment. Specifically, the manufacturing method was performed under the condition that, when etching the first conductivity type region 20, the plasma power is 27 kw, sulfur hexafluoride gas is used at a flow rate of 10000 sccm, and the volume ratio of sulfur hexafluoride gas to oxygen gas is 3.3.

In the case of a comparative example in FIG. 4, a photovoltaic solar cell was manufactured under the same condition as that in the implementation example and with the same method as that in the implementation example, except that, when etching the first conductivity type region 20, the plasma power is 22.5 kw, sulfur hexafluoride gas is used at a flow rate of 3000 sccm, and the volume ratio of sulfur hexafluoride gas to oxygen gas is 10.

With reference to FIG. 4, in the case of the photovoltaic solar cell in the implementation example, a value of the leakage current is approximately 1.7 A to approximately 3 A and an average value of the leakage current is 2.4 A. In contrast, in the case of the photovoltaic solar cell in the comparative example, the value of the leakage current is approximately 4 A to 5 A, and the average value of the leakage current is 4.7 A.

That is, in the case of the implementation example in FIG. 4, when etching the first conductivity type region 20 by the reactive ion etching, the plasma power, the amount of sulfur hexafluoride gas, and the volume ratio of sulfur hexafluoride gas to oxygen gas are controlled to be at a suitable level. Thus, the control passivation layer and the first conductivity type region, which remain on the edge portion of the flank surface and the opposite surface of the semiconductor substrate. are minimized. As a result, it is ensured that the value of the leakage current is remarkably reduced.

Specifically, a size of the first conductivity type region 20, which remains on the semiconductor substrate after etching the first conductivity type region 20, is equal to or smaller than approximately 10 nm, and thus the occurrence of the leakage current is minimized.

Subsequently, the forming of the V-shaped protrusion 112b is described with reference to FIG. 3D.

Specifically, the V-type protrusion 112a is formed in the opposite surface of the semiconductor substrate from which the first conductivity type region 20, or the first conductivity type region 20 and/or the control passivation layer 50 are removed. Additionally, by the reactive ion etching, the V-shaped protrusion 112b is formed on flank surfaces of the semiconductor substrate 110, the control passivation layer 50 and the first conductivity type region 20.

That is, when forming the minute V-shaped protrusion 112b on the V-shaped protrusion 112a or on surfaces of the V-shaped protrusion 112a on the opposite surface of the semiconductor substrate 110, the flank surfaces of the semiconductor substrate 110, and the control passivation layer 50 and/or the first conductivity type region 20 are etched by the reactive ion etching, and flank surface isolation processing is performed together. Accordingly, the front surface reflectivity decreases, and at the same time, the flank surface isolation processing is performed together. Therefore, a separate processing for isolation is not required. Thus, the processing is simplified.

Then, in the drawings, it is illustrated that the flank surface of the semiconductor substrate 110 is uniformly etched, but the present invention is not limited to this. That is, as described above, a portion on which the first conductivity type region 20 is formed is amorphous, and thus the portion on which the first conductivity type region 20 is formed is more etched.

Figure 5A:
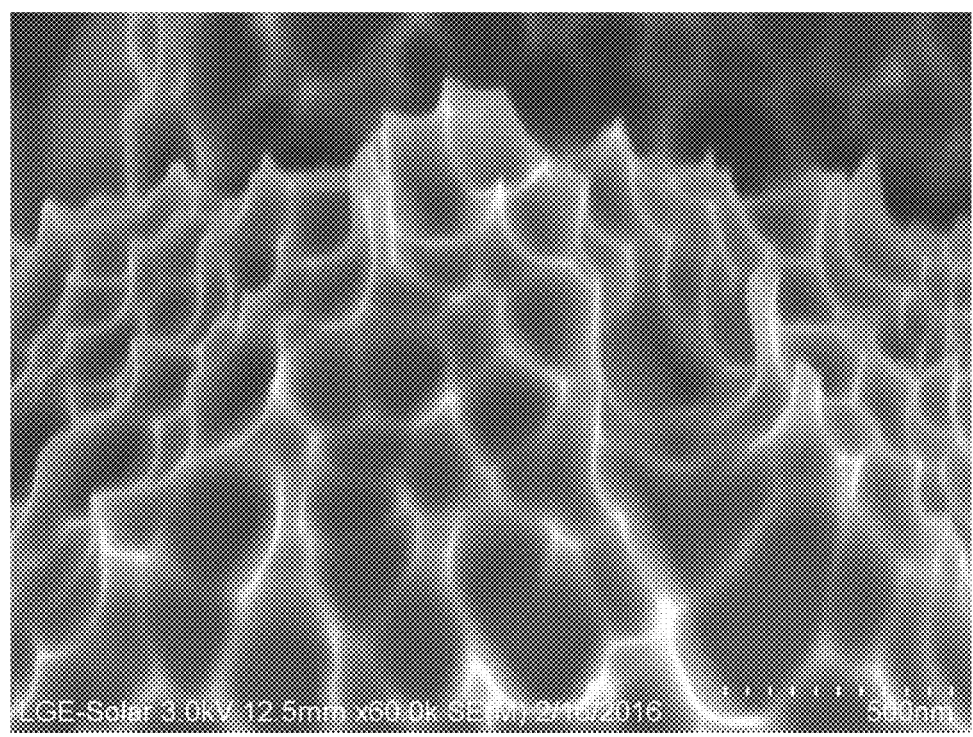
FIG. 5A is a photograph that results from a scanning electron microscopy (SEM) instrument revealing a minute V-shaped protrusion that is formed on the opposite surface of the semiconductor substrate.
Figure 5B:
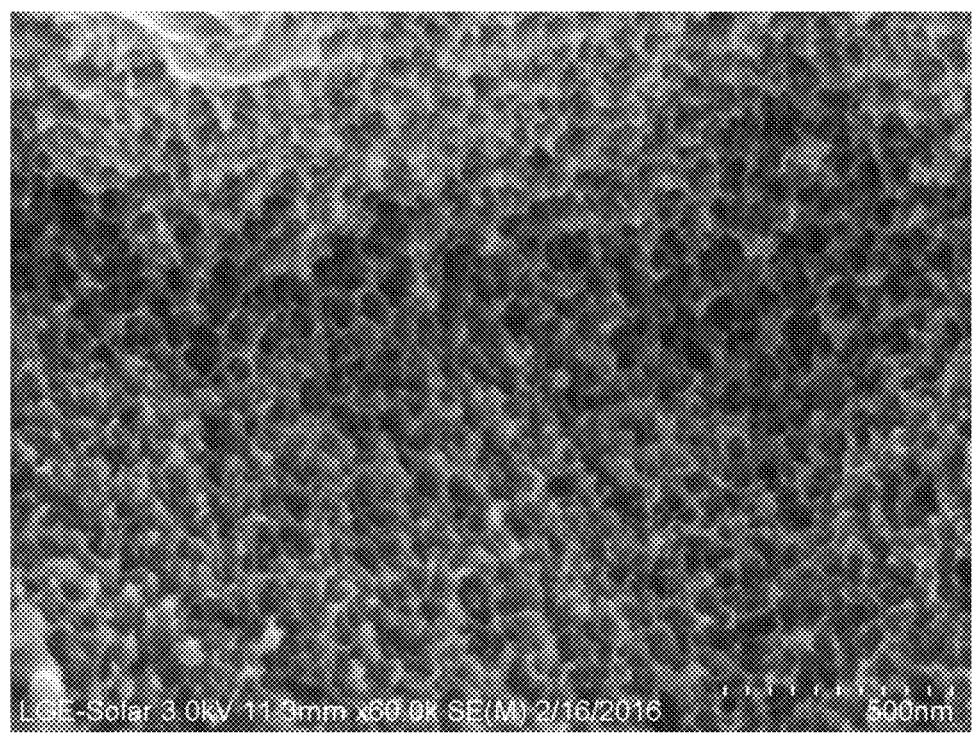
FIG. 5B is a photograph that results from the scanning electron microscopy instrument revealing a minute V-shaped protrusion that is formed on a flank surface of the semiconductor substrate.

Furthermore, with reference to FIGS. 5A and 5B, a size of the minute V-shaped protrusion 112b that is formed in the opposite of the semiconductor substrate 110 may be different a size of the minute V-shaped protrusion 112b that is formed in the flank surface of the semiconductor substrate 110. More specifically, the size of the minute V-shaped protrusion 112b that is formed in the opposite surface of the semiconductor substrate 110 may be greater than the size of the minute V-shaped protrusion 112b that is formed on the flank surface of the semiconductor substrate 110.

In the present specification, the size of the minute V-shaped protrusion 112b may mean a distance between each of the low points of the V-shaped protrusions.

For example, the size of the minute V-shaped protrusion that is formed in the opposite surface of the semiconductor substrate 110 ranges from approximately 100 nm to approximately 300 nm, and the size of the minute V-shaped protrusion ranges from approximately 50 nm to approximately 100 nm.

In the present embodiment, control is performed in such a manner that the size of the minute V-shaped protrusion 112b that is formed in the opposite surface of the semiconductor substrate 110 is greater than the size of the minute V-shaped protrusion 112b that is formed in the flank surface of the semiconductor substrate 110. Thus, the leakage current is minimized.

Specifically, in a case where the size of the size of the minute V-shaped protrusion 112b that is formed in the flank surface of the semiconductor substrate 110 is greater than the size of the minute V-shaped protrusion 112b that is formed in the opposite surface of the semiconductor substrate 110, a surface area of the flank surface of the semiconductor substrate 110 increases to that which is greater than a surface area of the opposite surface of the semiconductor substrate 110, and thus the second conductivity type region 30 that will be formed subsequently is formed less on the flank surface of the semiconductor substrate 110 than on the opposite surface of the semiconductor substrate 110. As a result, the second conductivity type region 30 that is formed on the flank surface of the semiconductor substrate is easily removed and shunt occurs less frequently.

However, the description of the reactive ion etching that etches the first conductivity type region 20 described above applies similarly to the reactive ion etching that forms the minute V-shaped protrusion 112b, except for a feature of the reactive ion etching that forms the minute V-shaped protrusion 112b, which will be described.

However, for the reactive ion etching that forms the minute V-shaped protrusion 112b, chlorine gas is further included and there is a difference in the ratio of oxygen gas to sulfur hexafluoride gas and a ratio of oxygen gas to chlorine gas, when compared with the reactive ion etching that etches the first conductivity type region 20 and the like. Thus, a process of forming the minute V-shaped protrusion 112b forming the semiconductor substrate 110 is optimized.

A mixture gas that results for adding chlorine gas ($C_{12}$) to sulfur hexafluoride gas and oxygen gas is used during the reactive ion etching that forms the minute V-shaped protrusion 112b. At this point, the roles of sulfur hexafluoride gas and oxygen gas are the same as or similar to the roles described in the case of the reactive ion etching that etches the first conductivity type region 20.

Chlorine gas increases the etching speed and induces isotropic etching, and thus plays a role in adjusting a width and a height of the minute V-shaped protrusion 112b that is formed in the opposite surface of the semiconductor substrate 110. Accordingly, the reactive ion etching that forms the minute V-shaped protrusion 112b causes etching that is fundamentally isotropic etching, and chlorine gas partly induces anisotropic etching.

Accordingly, the opposite surface of the semiconductor substrate 110 is etched uniformly and minutely, and thus the minute V-shaped protrusion 112b is formed that is smaller in size than the V-shaped protrusion 112a.

At this time, the volume ratio of sulfur hexafluoride gas to oxygen gas is equal to or greater than 1. Although the ratio of sulfur hexafluoride gas to oxygen gas decreases relatively in the reactive ion etching that forms the minute V-shaped protrusion 112b, chlorine gas ensures a sufficient etching speed.

Therefore, oxygen gas is introduced at the volume ratio of oxygen gas to sulfur hexafluoride gas that is greater than 1, and a mask effect is sufficiently achieved. Thus, the damage to the semiconductor substrate 110 is effectively prevented. As an example, the volume ratio of sulfur hexafluoride gas to oxygen gas may be 1 to 2. When the volume ratio is smaller than 1, the width of the minute V-shaped protrusion 112b is narrow, and when the volume ratio exceeds 2, the height of the minute V-shaped protrusion 112b decreases. Thus, the minute V-shaped protrusion 112b has difficulty taking a shape suitable for preventing reflection, or such a shape is difficult to form minutely and uniformly.

Then, the volume ratio of chlorine gas to oxygen gas is equal to or greater than 1. This is because even a small amount of chlorine gas increases the etching speed.

As an example, the volume ratio of chlorine gas to oxygen gas may be 0.2 to 1. When the volume ratio is lower than 0.2, the width of the minute V-shaped protrusion 112b is narrow, and when the volume ratio exceeds 1, the height of the minute V-shaped protrusion 112b decreases. Thus, the minute V-shaped protrusion 112b has difficulty taking a shape suitable for preventing reflection, or such a shape is difficult to form minutely and uniformly.

Then, a pressure for the reactive ion etching that forms the minute V-shaped protrusion 112b is lower than a pressure for the reactive ion etching that etches the first conductivity type region 20. This is because oxygen gas that is used for a mask is used at the high volume ratio in the reactive ion etching that forms the minute V-shaped protrusion 112b and thus pressure increases. As a result, the increase in the pressures increase the number of by-products and makes it difficult for the minute V-shaped protrusion 112b to be formed.

As an example, the pressure for the reactive ion etching that forms the minute V-shaped protrusion 112b may range from 0.1 torr to 0.8 torr. When the pressure is lower than 0.1 torr, a density of plasma is unstable. When the pressure exceeds 0.8 torr, the number of by-products in the surface of the semiconductor substrate 110 increases, and thus the minute V-shaped protrusion 112b is difficult to form. However, the present invention is not limited to this, the pressure may vary that is applied for the reactive ion etching that forms the minute V-shaped protrusion 112b.

With reference again to FIGS. 1 to 3D, the minute V-shaped protrusion 112b that is formed by the reactive ion etching that forms the minute V-shaped protrusion 112b is formed on the V-shaped protrusion 112a and has a smaller size than the V-shaped protrusion 112a. The reactive ion etching forms the minute V-shaped protrusion 112b on the surface of the semiconductor substrate 110 in a minute, uniform manner regardless of the crystal direction of the crystal particle. At this time, the minute V-shaped protrusion 112b is formed to have a pointed upper end portion and has an average nanometer size.

In this manner, in the present embodiment, the minute V-shaped protrusion 112b, which has a small size than the V-shaped protrusion 112a, on the V-shaped protrusion 112a that is positioned on the opposite surface of the semiconductor substrate 110, and thus the reflection that occurs on the surface of the semiconductor substrate 110 is minimized. Accordingly, a surface area of a rear surface of the semiconductor substrate 110 that has relatively small-sized particles of light is minimized and the damage due to the reactive ion etching is minimized. A passivation property is improved.

In the present embodiment, the reactive ion etching that removes the first conductivity type region 20 and the reactive ion etching that forms the minute V-shaped protrusion 112b are performed by an in-situ process that include successive processes the same apparatus. Therefore, according to process conditions, the cross-sectional etching is performed in the first conductivity type region, and an etching method of forming the minute V-shaped protrusion 112b is performed to form the minute V-shaped protrusion 112b.

As described above, in the present embodiment, the volume ratio of sulfur hexafluoride gas to oxygen gas is approximately 3 to approximately 5 during the reactive ion etching that etches the first conductivity type region 20, and the volume ratio of sulfur hexafluoride gas to oxygen gas approximately 1 to approximately 2 during the reactive ion etching that forms the minute V-shaped protrusion 112b, which is subsequently performed. Thus, a volume ratio of oxygen gas that is used to form the minute V-shaped protrusion 112b to oxygen gas that is used to etch the first conductivity type region 20 is approximately 1.5 to approximately 5.

The volume ratio is desirably approximately 1.5 to approximately 3, and more desirably approximately 1.5 to 2.

That is, in the case of the present embodiment, a process for the reactive ion etching that etches the first conductivity type region 20 and a process for the reactive ion etching that forms the minute V-shaped protrusion 112b are successively performed by the in-situ process of controlling gas build-up and pressure division within the same chamber. Therefore, the more similar gas atmospheres of the two processes are to each other, the more the processing capability is improved and the easily the control is performed.

Therefore, the volume ratio of oxygen gas that is used to etch the first conductivity type region 20 to oxygen gas that is used to form the minute V-shaped protrusion 112b is maintained within the range described above. Thus, the process is easily performed and the productivity is improved.

Subsequently, with reference to FIG. 3A, the forming of the second conductivity type region 30 is described.

A dopant is introduced (diffused) into the semiconductor substrate 110 through the opposite surface of the semiconductor substrate 110, and thus, the second conductivity type region 30 is formed. Specifically, in a case where the conductivity type of the semiconductor substrate 110 is n type, the second conductivity type dopant that is opposite, in conductivity type, to the first conductivity type dopant is introduced (or diffused) into the N-type substrate through a light receiving surface of the N-type substrate, and thus, the second conductivity type region 30 that functions as an emitter is formed. In a case where the conductivity type of the semiconductor substrate 110 is p type, the first conductivity type dopant is introduced (or diffused) into the P-type substrate through a light receiving surface of the P-type substrate, and thus, the second conductivity type region 30 that functions as a front surface field layer is formed. Various methods of introducing a dopant into the semiconductor substrate 110 through the opposite surface of the semiconductor substrate 110 are used. For example, techniques, such as an ion implantation technique, a thermal diffusion technique, and a laser doping technique, are used. Alternatively, techniques are used such as a technique in which, after a dopant film (for example, a boron silicate glass (BSG) film) that contains the second conductivity type dopant is formed on the opposite surface of the semiconductor substrate 110, the second conductivity type dopant is diffused by performing thermal processing and then the dopant film is moved. Particularly, the ion implantation technique and the method of forming the dopant film are advantageous for anisotropic etching.

After the second conductivity type dopant is introduced, the thermal processing may be additionally performed to activate the second conductivity type dopant. The thermal processing for the activation is not necessarily performed and may be omitted according to the doping technique and the like.

As an example, the first and second conductivity type regions 20 and 30 are formed and then the first conductivity type dopant in the first conductivity type region 20 and the second conductivity type dopant in the second conductivity type region 30 are activated together by performing the thermal processing for co-activation.

However, the method of forming the second conductivity type region 30, whether or not to perform the thermal processing, and the like are not limited to the descriptions provided above, and those that are apparent to a person of ordinary skill in the art fall within the scope of the present invention.

For example, in a case where the conductivity type of the semiconductor substrate 110 is p-type, the second conductivity type region 30 is the same p-type as the semiconductor substrate 110. Thus, the second conductivity type region 30 plays a role of a front surface field (FSF).

Subsequently, as illustrated in FIG. 3F, a passivation film 32 and a reflection prevention film 34 are formed, in this order, on the opposite surface of the semiconductor substrate 110, and the passivation film 22 is formed on one surface of the semiconductor substrate 110. That is, the passivation film 32 and the reflection prevention film 34 are formed on the entire opposite surface of the semiconductor substrate 110, and the passivation film 22 is formed on one entire surface of the semiconductor substrate 110 to cover the first conductivity type region 20. The passivation films 22 and 32 and the reflection prevention film 34 are formed by performing a technique, such as a vacuum deposition technique, a chemical vapor deposition technique, a spin coating technique, a screen printing technique, or a spray coating technique. The order in which the passivation films 22 and 32 and the reflection prevention film 34 are formed is variously changed.

Subsequently, with reference to FIGS. 1 and 3G, the first and second electrodes 42 and 44 that are connected to the first conductivity type region 20 and the second conductivity type region 30, respectively, are formed.

Specifically, with reference to FIG. 1, each of the first and second electrodes 42 and 44 includes a plurality of finger electrodes, each of which is separated from the next, by a distance. Then, each of the first and second electrodes 42 and 44 includes a bus-bar electrode that is formed in a direction in which it intersects the finger electrodes and thus connects the finger electrodes. Only one bus-bar electrode may be provided, or a plurality of bus-bar electrodes, each of which is separated from the next, by a greater distance than each of the finger electrodes is separated from the next, may be provided.

With reference again to FIG. 3G, an opening portion 104 and an opening portion 102 are formed in the passivation film and the reflection prevention film 34, and in the passivation film 22, respectively, and then the first and second electrodes 42 and 44 are formed within the opening portions 102 and 104, respectively, by performing a technique such as a metallization technique or a deposition technique.

As an example, a paste for forming the second electrode and a paste for forming the first electrode may be dispensed on the second passivation film 32 and the reflection prevention film 34 and on the first passivation film 22, respectively, by performing screen printing and the like, and then the first and second electrodes 42 and 44 may be formed while forming the openings 102 and 104, respectively, through the use of fire through, laser firing contact, or the like. In this case, when the first and second electrodes 42 and 44 are fired, the opening portions 102 and 104 are formed, and therefore, a processing of forming the openings 102 and 104 does not need to be separately performed.

The features, the structures, the effects, and the like, as described above, are included in at least one embodiment of the present invention, and are not necessarily limited to one embodiment. Furthermore, it is apparent to a person of ordinary skill that the features, the structures, the effects, and the like which are described in one embodiment are also combined and changed for implementation in other embodiments. Therefore, the details of the combination and the change should be interpreted to fall within the scope of the present invention.

What is claimed is:

1. A method of manufacturing a photovoltaic solar cell, the method comprising:
    forming a polycrystalline layer, which is a first conductivity type region that contains a first conductivity type dopant, on one surface of a single crystalline semiconductor substrate and an opposite surface that is opposite to the one surface simultaneously by performing a Low-Pressure Chemical Vapor Deposition (LPCVD);
    performing a first dry etching to remove the polycrystalline layer, which is the first conductivity type region, doped with the first conductivity dopant and formed on the opposite surface of the single crystalline semiconductor substrate, remaining the polycrystalline which is the first conductivity type region, doped with the first conductivity dopant and formed on the one surface of the single crystalline semiconductor substrate, and to remove an edge portion of the polycrystalline layer, which is the first conductivity type region, doped with the first conductivity dopant and formed on the one surface of the single crystalline semiconductor substrate to provide an isolation, and performing a second dry etching continuously to form a minute V-shaped protrusion on the opposite surface of the single crystalline semiconductor substrate; and
    forming a second conductivity type region that contains a second conductivity dopant on the opposite surface of the single crystalline semiconductor substrate by diffusing the second conductivity dopant into the single crystalline semiconductor substrate,
    wherein the first dry etching is performed by reactive ion etching (RIE) using sulfur hexafluoride gas and oxygen gas,
    wherein a volume ratio of the sulfur hexafluoride gas to the oxygen gas is 3 to 5, and
    wherein the minute V-shaped protrusion is further formed on an inclined portion of the first conductivity type region on the one surface of the single crystalline semiconductor substrate, the inclined portion being a part that remained after the edge portion of the first conductivity type region that was removed by the first dry etching.

2. The method of manufacturing a photovoltaic solar cell according to claim 1, wherein an amount of the sulfur hexafluoride gas is used at a flow rate of 8000 sccm to 10000 sccm.

3. The method of manufacturing a photovoltaic solar cell according to claim 1, wherein a plasma power for the reactive ion etching is 25 kw to 30 kw.

4. The method of manufacturing a photovoltaic solar cell according to claim 1, wherein a pressure for the second dry etching to form the minute V-shaped protrusion is equal to or higher than that for the first dry etching to remove the first conductivity type region.

5. The method of manufacturing a photovoltaic solar cell according to claim 1, wherein the first dry etching of the first conductivity type region and the second dry etching to form the minute V-shaped protrusion are performed by an in-situ process.

6. The method of manufacturing a photovoltaic solar cell according to claim 1, further comprising;
    forming a control passivation layer on the one surface of the single crystalline semiconductor substrate before the forming the first conductivity type region, wherein the forming of the first conductivity type region and the forming of the control passivation layer are performed by an in-situ process.

7. The method of manufacturing a photovoltaic solar cell according to claim 1, wherein the performing of the second dry etching to form the minute V-shaped protrusion uses sulfur hexafluoride gas, oxygen gas, and chlorine gas.

8. The method of manufacturing a photovoltaic solar cell according to claim 7, wherein a volume ratio of the sulfur hexafluoride gas to the oxygen gas is 1 to 2.

9. The method of manufacturing a photovoltaic solar cell according to claim 7, wherein a volume ratio of the chlorine gas to the oxygen gas is 0.2 to 1.

10. The method of manufacturing a photovoltaic solar cell according to claim 7, wherein a volume ratio of the oxygen gas that is used when removing the first conductivity type region and the oxygen gas that is used when performing the second dry etching to form the minute V-shaped protrusion is 1.5 to 5.

11. The method of manufacturing a photovoltaic solar cell according to claim 1, wherein before forming the first conductivity type region, a V-shaped protrusion is not formed on the one surface and is formed on the opposite surface among the one surface and the opposite surface of the single crystalline semiconductor substrate.

12. The method of manufacturing a photovoltaic solar cell according to claim 11, wherein the forming of the v-shaped protrusion on the opposite surface of the single crystalline semiconductor substrate is performed by wet etching.

13. The method of manufacturing a photovoltaic solar cell according to claim 12, wherein the minute V-shaped protrusion is formed on a surface of the V-shaped protrusion.

14. A method of manufacturing a photovoltaic solar cell, the method comprising;
   forming a first conductivity type region that contains a first conductivity dopant, on one surface of a semiconductor substrate and an opposite surface that is opposite to the one surface;
   performing a first dry etching to remove the first conductivity type region formed on the opposite surface of the semiconductor substrate and to remove an edge portion of the first conductivity type region formed on the one surface of the semiconductor substrate to provide an isolation, and performing a second dry etching continuously to form a minute V-shaped protrusion on the opposite surface of the semiconductor substrate; and
   forming a second conductivity type region that contains a second conductivity dopant on the opposite surface of the semiconductor substrate,
   wherein the first dry etching is performed by reactive ion etching (RIE) using sulfur hexafluoride gas oxygen gas,
   wherein a volume ration of the sulfur hexafluoride gas to the oxygen gas is 3 to 5, and
   wherein the minute V-shaped protrusion is further formed on an inclined portion of the first conductivity type region on the one surface of the semiconductor substrate, the inclined portion being a part that remained after the edge portion of the first conductivity type region that was removed by the first dry etching.

\* \* \* \* \*